US012610198B2

(12) United States Patent
Chen et al.

(10) Patent No.: US 12,610,198 B2
(45) Date of Patent: Apr. 21, 2026

(54) MEMS MICROPHONE

(71) Applicant: AAC Technologies Pte. Ltd.,
Singapore (SG)

(72) Inventors: Yu Chen, Singapore (SG); Rong Ong,
Singapore (SG); Chun Pheng Tan,
Singapore (SG)

(73) Assignee: AAC Technologies Pte. Ltd.,
Singapore (SG)

( * ) Notice: Subject to any disclaimer, the term of this
patent is extended or adjusted under 35
U.S.C. 154(b) by 158 days.

(21) Appl. No.: 18/764,389

(22) Filed: Jul. 5, 2024

(65) Prior Publication Data

US 2026/0012734 A1 Jan. 8, 2026

(51) Int. Cl.
  *H04R 19/04* (2006.01)
  *B81B 7/00* (2006.01)
  *H04R 7/04* (2006.01)
  *H04R 7/16* (2006.01)

(52) U.S. Cl.
  CPC ........... *H04R 19/04* (2013.01); *B81B 7/0016*
    (2013.01); *H04R 7/04* (2013.01); *H04R 7/16*
    (2013.01); *B81B 2201/0257* (2013.01); *B81B*
      *2203/0127* (2013.01); *B81B 2203/0384*
      (2013.01); *H04R 2201/003* (2013.01)

(58) Field of Classification Search
  CPC .......... B81B 7/0016; B81B 2201/0257; B81B
      2203/0127; B81B 2203/0384; H04R
      19/04; H04R 7/04; H04R 7/16; H04R
      2201/003
  See application file for complete search history.

(56) References Cited

PUBLICATIONS

Sun et al. "A Resonance Piezoelectric MEMS Microphone With
Wide Frequency Band and High Sensitivity". Figs. 1-3, All pages
(Year: 2021).*
Rong et al. "Microphone Assembly and Electronic Device". Figs.
6-8, All pages (Year: 2023).*

* cited by examiner

*Primary Examiner* — Brian Ensey
(74) *Attorney, Agent, or Firm* — Wiersch Law Group

(57) ABSTRACT

Provided is a MEMS microphone including: a substrate
having a cavity penetrating thereon; a diaphragm supported
by the substrate and covering the cavity; a back plate
provided above the diaphragm, wherein a first preset gap is
formed between the back plate and the diaphragm; and a first
support member received in the cavity includes a support
portion, a connection portion, and a convex portion. The
connection portion extends from the support portion towards
the substrate until being fixed to the substrate. The convex
portion extends from an end of the support portion
approaching the diaphragm towards the diaphragm until
supporting the diaphragm. The diaphragm and the connec-
tion portion form a second preset gap along a vibration
direction of the diaphragm. The diaphragm of the MEMS
microphone has higher robustness and higher anti-dropping
capability.

10 Claims, 5 Drawing Sheets

MEMS MICROPHONE

TECHNICAL FIELD

The present disclosure relates to the technical field of microphone, and in particular, to a micro electro mechanical system (MEMS) microphone.

BACKGROUND

In the prior art, the MEMS microphone includes a substrate, a diaphragm arranged on the substrate and a back plate arranged on the diaphragm. The diaphragm and the back plate serve as two electrode plates to form a capacitor. When the diaphragm vibrates under the action of sound waves, the capacitance of the capacitor changes accordingly, so that the acoustic signal can be converted into an electrical signal to realize the detection of the acoustic signal.

During the use of MEMS microphones, when the impact force of sound waves is so large that the diaphragm tends to move significantly, the deviation amplitude of the diaphragm is too large, thereby resulting in damage to the diaphragm.

SUMMARY

The purpose of the present disclosure is to provide a MEMS microphone to solve the technical problem in the prior art, which can prevent the diaphragm damage caused by excessive deviation amplitude of the diaphragm.

The present disclosure provides a MEMS microphone. The MEMS microphone includes a substrate, a diaphragm, a back plate, and a first support member.

A cavity is provided penetrating the substrate.

The diaphragm is supported by the substrate, and covers the cavity.

The back plate is provided above the diaphragm, and a first preset gap is formed between the back plate and the diaphragm.

The first support member is received in the cavity. The first support member includes a support portion and a connection portion. The support portion and the substrate are arranged at intervals. The connection portion extends from the support portion towards the substrate to be fixed to the substrate. The first support member further includes a convex portion extending from an end of the support portion approaching the diaphragm towards the diaphragm for supporting the diaphragm. The diaphragm and the connection portion form a second preset gap along a vibration direction of the diaphragm.

In an embodiment, a width of the e second preset gap along the vibration direction is greater than or equal to 10 μm.

In an embodiment, the convex portion supports the diaphragm at a geometric center of the diaphragm.

In an embodiment, a second support member is provided between the back plate and the diaphragm, and two opposite ends of the second support member are connected to geometric centers of the back plate and the diaphragm, respectively.

In an embodiment, the support portion includes a support portion bottom end away from the diaphragm and a support portion top end approaching the diaphragm along the vibration direction. From the support portion bottom end to the support portion top end, a width of a section of the support portion along a normal direction of the vibration direction of the diaphragm decreases gradually and linearly.

In an embodiment, the connection portion includes a connection portion bottom end away from the diaphragm and a connection portion top end approaching the diaphragm along the vibration direction. From the connection portion bottom end to the connection portion top end, a width of a section of the connection portion along the normal direction of the vibration direction of the diaphragm decreases gradually.

In an embodiment, the width of the section of the support portion satisfies: $d_1 > 2d_0$, where $d_1$ represents the width value of the section of the support portion bottom end, and $d_0$ represents half of the difference between the width value of the section of the support portion bottom end and the width value of the section of the support portion top end.

In an embodiment, the width of the section of the connection portion satisfies $d_2 < 2d_0$, where $d_2$ represents the width value of the section of the support portion bottom end, and $d_0$ represents half of the difference between the width value of the section of the support portion bottom end and the width value of the section of the support portion top end.

In an embodiment, a plurality of connection portions are provided. The plurality of connection portions are provided at intervals annularly with an axis along the vibration direction of the diaphragm as a center line.

In an embodiment, four connection portions are provided. Two adjacent connection portions form an angle of 90°.

Compared with the prior art, the first support member is provided in the present disclosure to support the diaphragm, so as to effectively prevent the structural deformation of the diaphragm and improve the robustness of the diaphragm. When the impact force of the sound wave is too large, the diaphragm is prevented from being damaged because the diaphragm is supported by the first support member and would not move significantly.

REFERENCE SIGNS

Figure 1:
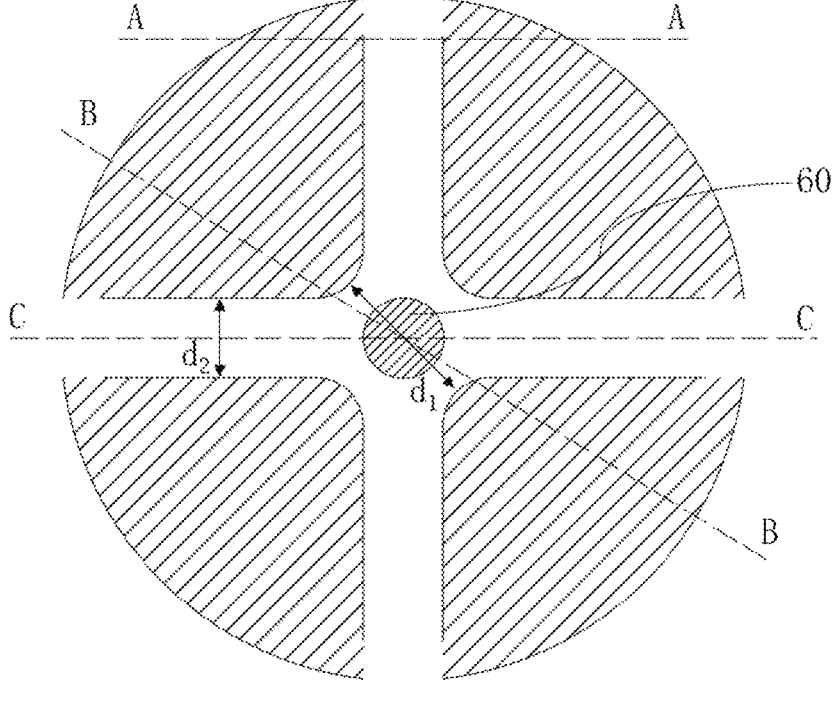
FIG. 1 is a structural diagram of the section of the overall structure of the present disclosure along the normal direction of vibration direction of the diaphragm.

10—substrate, 20—cavity, 30—diaphragm, 40—back plate, 50—first preset gap, 60—first support member, 601—support portion, 6011—support portion bottom end, 6012—support portion top end, 602—connection portion, 6021—connection portion bottom end, 6022—connection portion top end, 603—convex portion, 70—second preset gap, 80—second support member, 90—first isolation layer, 100—second isolation layer.

DESCRIPTION OF EMBODIMENTS

The embodiments described accompanied with reference drawings are exemplary, and are just for the purpose of illustrating the present disclosure, but not intended to limit the present disclosure.

As shown in FIGS. 1 to 5, an embodiment of the present disclosure provides a MEMS microphone including a substrate 10, a diaphragm 30, a back plate 40, and a first support member 60.

The substrate 10 may adopt silicon substrate, and a cavity 20 is provided penetrating the substrate 10. In an embodiment, the inner outline of the cavity 20 is a circular groove structure.

The diaphragm 30 may be made of polysilicon. The diaphragm 30 is supported on the substrate 10 and covers the cavity 20. In an embodiment, a first isolation layer 90 is provided between the diaphragm 30 and the substrate 10. The material of first isolation layer 90 may be phosphosilicate glass (PSG) or borosilicate glass (BPSG), etc., which is formed by plasma-enhanced chemical vapor deposition to support the diaphragm 30.

The back plate 40 can be formed by polysilicon, the back plate 40 is supported on the diaphragm. A first preset gap 50 is formed between the back plate 40 and the diaphragm 30. In an embodiment, a second isolation layer 100 is provided between the diaphragm 30 and the back plate 40. The material of the second isolation layer 100 may be phosphosilicate glass (PSG) or borosilicate glass (BPSG), which is formed by plasma-enhanced chemical vapor deposition to support the back plate 40.

The electrodes arranged opposite to each other on the back plate 40 and the diaphragm 30 form a capacitor that changes the distance between the diaphragm 30 and the back plate 40 in response to the pressure applied to the diaphragm 30. As a result, the capacitance is changed, so that acoustic signals can be converted into electrical signals, so as to realize detecting the acoustic signals.

The first support member 60 is received in the cavity 20, and includes a support portion 601 and a connection portion 602. The connection portion 602 and the substrate 10 are arranged at intervals. The support portion 601 and the connection portion 602 are preferably integrated as a whole, or may also be formed independently, which is not limited herein. The connection portion 602 extends from the support portion 601 towards the substrate 10 until being fixed to the substrate 10. The two opposite ends of the connection portion 602 are connected to the support portion 601 and the inner wall of the cavity 20, respectively. The support portion 601 is fixed in the cavity 20 via the connection portion 602.

The first support member 60 also includes a convex portion 603 extending from the end of the support portion 601 approaching the diaphragm 30 towards the diaphragm 30 until supporting the diaphragm 30. The convex portion 603 and the support portion 601 are preferably integrated as a whole, and may also be formed independently, which is not limited herein. The convex portion 603 supports the diaphragm 30 on the side of the diaphragm 30 facing the cavity 20, so that the structural deformation of the diaphragm 30 can be effectively prevented, the robustness of the diaphragm 30 can be improved, and the diaphragm 30 can withstand large sound pressure. In this case, when the pressure applied to the diaphragm 30 is too large, the diaphragm 30 is prohibited from deviating too much in the direction towards the cavity 20, thereby preventing the diaphragm 30 from being damaged.

Figure 4:
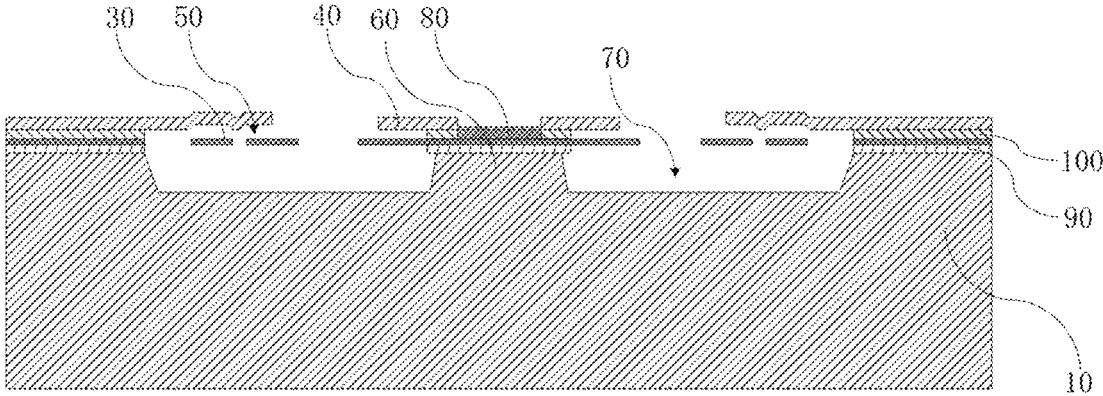
FIG. 4 is a C-C sectional view of FIG. 1.

Further, as shown in FIG. 4, the diaphragm 30 and the connection portion 602 form a second preset gap 70 along the vibration direction of the diaphragm 30. During the offset process of the diaphragm 30, the connection portion 602 does not limit the movement of the diaphragm 30, so as to guarantee the flexibility of the diaphragm 30, decrease the stiffness of the diaphragm 30, and improve the mechanical sensitivity of the MEMS microphones. In an embodiment, a width of the second preset gap 70 along the vibration direction is greater than or equal to 10 μm.

In an embodiment of the present disclosure, the convex portion 603 supports the diaphragm 30 at the geometric center of the diaphragm 30. The central axis of the diaphragm 30 coincides with the central axis of the convex portion 603. The diaphragm 30 is connected to the first isolation layer 90 and the second isolation layer 100 in the circumferential direction. Thus, the deflection thereof is parabolic, reaches the maximum at the center of the diaphragm 30, declines to zero at the edge. Since the sensitivity of MEMS microphone depends on the ratio of capacitance changing with pressure, the convex portion 603 is arranged at the position where the movement of the diaphragm 30 is the most intense, that is, the center of the diaphragm 30, while the second preset gap 70 is retained between the connection portion 602 and the diaphragm 30, so as to reduce the stiffness of the diaphragm 30 and improve the sensitivity of the MEMS microphone.

Figure 2:
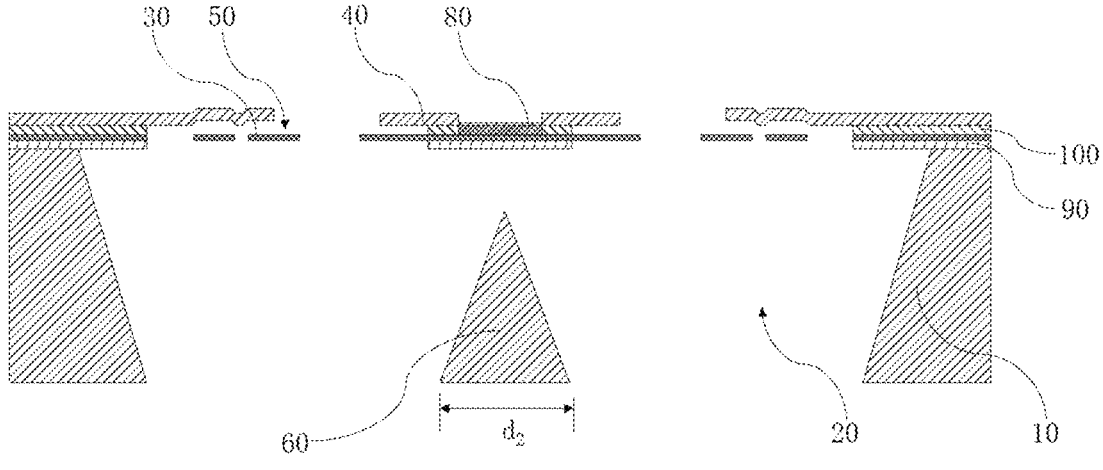
FIG. 2 is an A-A sectional view of FIG. 1.
Figure 3:
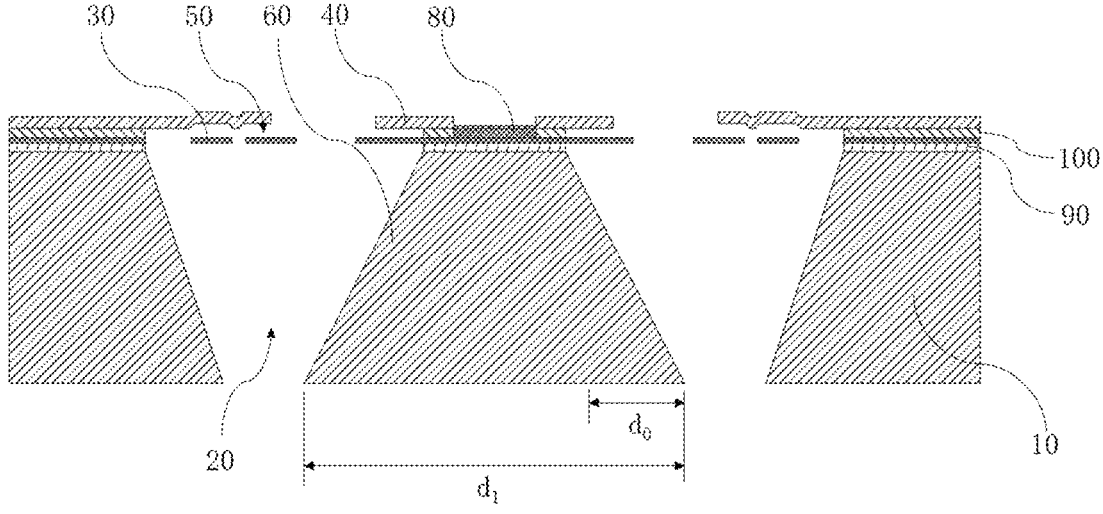
FIG. 3 is a B-B sectional view of FIG. 1.

Further, referring to FIGS. 2 to 4, a second support member 80 is provided between the back plate 40 and the diaphragm 30. The second support member 80 may be formed by a silicon nitride layer. The two opposite ends of the second support member 80 are connected to the centers of the back plate 40 and the diaphragm 30, respectively. The second support member 80 is opposite to the convex portion 603, so that the diaphragm 30 can withstand a large sound pressure. In this case, when the pressure applied to the diaphragm 30 is too large, the diaphragm 30 is prohibited from deviating too much in the direction towards the end of the diaphragm 30 approaching the back plate 40, thereby preventing the diaphragm 30 from being damaged.

In an embodiment of the present disclosure, along the direction from the cavity 20 to the back plate 40, the support portion 601 is of a structure with a gradually shrinking width. In a feasible implementation, referring to FIG. 5, the support portion 601 is of a column structure. From the cavity 20 to the back plate 40, the outer peripheral surface of the column structure shrinks gradually. In an example, the support portion 601 has a support portion bottom end 6011 away from the diaphragm 30 and a support portion tip 6012 approaching the diaphragm 30 along vibration direction. The end faces of the support portion bottom end 6011 and the support portion top end 6012 are both circular. The support portion top end 6012 abuts against the convex portion 603. In the direction from the support portion bottom end 6012 to the support portion top end 6011, the width of the section of the support portion 601 along the normal direction of the vibration direction of the diaphragm 30. In a feasible implementation, the outer outline surface of the convex portion 603 matches the outer outline surface of the support portion top end 6011, and the width of the convex portion 603 is equal to the width of the support portion top end 6011.

Owing to the size design of the shrinking width, the first support member 60 can not only support the diaphragm 30, but also avoid excessive influence on the flexibility of the diaphragm 30. When the pressure applied to the diaphragm 30 is too large, the first support member 60 can play a stopper role for the movement of the diaphragm 30. The diaphragm 30 moves centered with the convex portion 603. The outer circumferential surface of the support portion 601 is an inclined plane, so as to reduce the chance of contact collision between the diaphragm 30 and the outer surface of the support portion 601, and provide better protection for the diaphragm 30.

Further, as shown in FIG. 3, the section width of the support portion 601 satisfies the following formula: $d_1 > 2d_0$, where $d_1$ represents the section width value of the support portion bottom end 6011, and $d_0$ represents half of the difference between the section width value of the support portion bottom end 6011 and the section width value of the support portion top end 6012.

Figure 5:
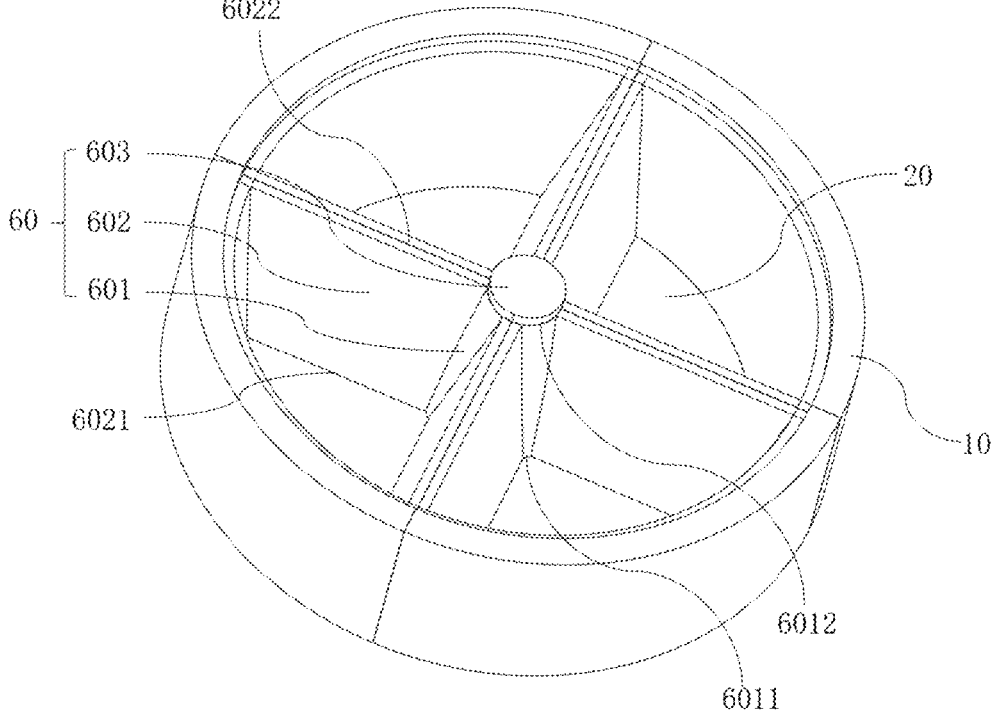
FIG. 5 is a perspective view of the first support member of the present disclosure when assembled into the substrate.

In an embodiment of the present disclosure, along the direction from the cavity 20 to the back plate 40, the connection portion 602 is of a structure with a gradually shrinking width. As shown in FIG. 5, the connection portion 602 is of a block structure, in the direction from the cavity 20 to the back plate 40, the outer peripheral surface of the block structure gradually shrinks, the connection portion 602 has a connection portion bottom end 6021 that is away from the diaphragm 30 and a connection portion top end 6022 approaching the diaphragm 30 along vibration direction. The end surface of the connection portion bottom end 6021 and the end surface of the connection portion top end 6022 are both rectangular. The spacing between the diaphragm 30 and the end face of the connection portion top end 6022 is the second preset gap 70. The longitudinal section of the connection portion 602 is a trapezoidal plane. Along the direction from the connection portion bottom end 6021 towards the connection portion top end 6011, the width of the section of the connection portion 602 along the normal direction of the vibration direction of the diaphragm 30 decreases gradually and linearly, and the position of the connection portion 602 corresponding to the diaphragm 30 reduces. As a result, the failure of the side contact collision with the connection portion 602 can be avoided during the vibration of the diaphragm 30.

Further, as shown in FIG. 2 and FIG. 3, the section width of the connection portion 602 satisfies the following formula: $d_2 < 2d_0$, $d_2$ represents the section width value of the connection portion bottom end 6021, and $d_0$ represents half of the difference between the section width value of the support portion bottom end 6011 and the section width value of the support portion top end 6012.

In an embodiment of the present disclosure, as shown in FIG. 5, there are a plurality of connection portions 602. The plurality of connection portions 602 are arranged annually at intervals with the axis of the support portion 601 along the vibration direction of the diaphragm 30. Each of the connection portions 602 is connected to the support portion 601 and the inner wall of the cavity 20, so that the support portion 601 can be more stably fixed in the cavity 20. When the MEMS microphone is subjected to a relatively large impact force, the support portion 601 can always support the diaphragm 30 in the center thereof, without any offset.

In an embodiment, there are four connection portions 602. Two adjacent connection portions 602 form angle of 90°, and thus form a "cross-like" shape structure. The support portion 601 is located in the center of the "cross-like" shape structure. One skilled in the art can know that the number of the connection portions 602 may also be set as other numbers, and the combination shape of the connection portions 602 may also be determined according to actual needs, such as "line" shape, "parallel lines" shapes, "sharp" shape, and Y shape, etc., which is not limited herein.

As shown in FIG. 3 and FIG. 5, the internal wall of the cavity 20 is inclined with respect to the vibration direction of the diaphragm 30. The inclined angle of the vibration direction of the cavity 20 shall be determined according to actual conditions, which will not be limited herein. In the related art, the inner wall of the cavity 20 is parallel to the vibration direction of the diaphragm 30. In contrast, in the embodiments of the present disclosure, the inner wall of the cavity 20 is inclined, the width of the cavity approaching the diaphragm 30 is greater than that of the cavity far away from the diaphragm 30, and the position of the cavity 20 corresponding to the diaphragm 30 is reduced, so that the failure of the internal contact collision between the diaphragm 30 and the cavity 20 during the vibration of the diaphragm 30.

Based on the MEMS microphone according to the above embodiments, the present disclosure also provides a manufacturing method including the following steps:

Step 1, the first isolation layer 90 was deposited on the substrate 10, and then the diaphragm 30 was formed on the first isolation layer 90.

Step 2, the second isolation layer 100 was deposited on the diaphragm 30.

Step 3, the back plate 40 was formed on the second isolation layer 100, and in Step 3, the second support member 80 could be formed in the second isolation layer 100.

Step 4, the cavity 20 and the first support member 60 were formed integratedly in the substrate 10 below the diaphragm 30. For example, the cavity 20 and the first support member 60 could be formed simultaneously in the substrate 10 by ion etching or chemical etching.

Step 5, the first isolation layer 90 between the diaphragm 30 and the first support member 60 were removed by chemical etching, while the second isolation layer 100 between the diaphragm 30 and the back plate 40 were removed, so as to form the first preset gap 50 between the back plate 40 and the diaphragm 30, and to form the second preset gap 70 between the diaphragm 30 and the connection portion 602.

Moreover, by setting $d_1$ as $d_1 > 2d_0$, it can be guaranteed that the second preset gap between the connection portion 605 of the first support member 60 and the diaphragm 30 have sufficient distance, so as to reduce the noise generated during the vibration of the diaphragm 30 and increase the signal-to-noise ratio of the MEMS microphone.

As above, the MEMS microphone according to the embodiments of the present disclosure is formed. By providing the first support member 60 to support the diaphragm 30, the MEMS microphone can effectively prevent the structural deformation of the diaphragm 30, improve the stiffness of the diaphragm 30. When the impact force of the sound waves is too large, the diaphragm 30 shall be prohibited from significant movement owing to being supported by the first support member 60, thereby preventing the diaphragm 30 from being damaged.

The various embodiments described above with reference to the drawings used to illustrate the construction, characteristics and functional effects in detail. The above are just better embodiments of the present disclosure, however, the present disclosure does not define the scope of implementation as shown in the drawings. Any change made under the ideas of the present disclosure, or equivalent embodiments modified as identical variations without departing from the spirit of the specification and drawings shall all fall within the scope of the present disclosure.

What is claimed is:

1. A micro electro mechanical system (MEMS) microphone comprising:

a substrate having a cavity penetrating thereon;

a diaphragm supported by the substrate and covering the cavity;

a back plate provided above the diaphragm, wherein a first preset gap is formed between the back plate and the diaphragm; and a first support member received in the cavity, comprising:

a support portion arranged with the substrate at intervals;

a connection portion extending from the support portion towards the substrate and fixed to the substrate; and a convex portion extending from an end of the support portion approaching the diaphragm towards the diaphragm for supporting the diaphragm, wherein a second preset gap is formed between the diaphragm and the connection portion along a vibration direction of the diaphragm.

2. The MEMS microphone as described in claim 1, wherein a width of the second preset gap along the vibration direction is greater than or equal to 10 μm.

3. The MEMS microphone as described in claim 1, wherein the convex portion supports the diaphragm at a geometric center of the diaphragm.

4. The MEMS microphone as described in claim 1, wherein a second support member is provided between the back plate and the diaphragm, and two opposite ends of the second support member along the vibration direction of the diaphragm are connected to geometric centers of the back plate and the diaphragm, respectively.

5. The MEMS microphone as described in claim 1, wherein the support portion comprises a support portion bottom end away from the diaphragm and a support portion top end approaching the diaphragm along the vibration direction, and wherein, from the support portion bottom end to the support portion top end, a width of a section of the support portion along a normal direction of the vibration direction of the diaphragm decreases.

6. The MEMS microphone as described in claim 5, wherein the connection portion comprises a connection portion bottom end away from the diaphragm and a connection portion top end approaching the diaphragm along the vibration direction, wherein, from the connection portion bottom end to the connection portion top end, a width of a section of the connection portion along the normal direction of the vibration direction of the diaphragm decreases.

7. The MEMS microphone as described in claim 6, wherein the width of the section of the support portion satisfies: $d_1 > 2d_0$, where $d_1$ represents a width value of the section of the support portion bottom end, and $d_0$ represents half of the difference between the width value of the section of the support portion bottom end and a width value of the section of the support portion top end.

8. The MEMS microphone as described in claim 6, wherein the width of the section of the connection portion satisfies $d_2 < 2d_0$, where $d_2$ represents a width value of the section of the support portion bottom end, and $d_0$ represents half of the difference between the width value of the section of the support portion bottom end and a width value of the section of the support portion top end.

9. The MEMS microphone as described in claim 1, wherein a plurality of connection portions are provided, and the plurality of connection portions are provided at intervals annularly with an axis along the vibration direction of the diaphragm as a center line.

10. The MEMS microphone as described in claim 9, wherein four connection portions are provided, and two adjacent connection portions form an angle of 90°.

\* \* \* \* \*